(12) United States Patent
Knowles et al.

(10) Patent No.: US 6,291,316 B1
(45) Date of Patent: Sep. 18, 2001

(54) METHOD FOR FABRICATING PASSIVATED SEMICONDUCTOR DEVICES

(75) Inventors: Christopher Michael Knowles; Yih-Yin Lin; Tung-Chieh Lin; William John Nelson; Hung-Ping Tsai; Richard Sean O'Rourke, all of Taipei (TW)

(73) Assignee: General Semiconductor of Taiwan, LTD, Taipei (TW)

( * ) Notice: Subject to any disclaimer, the term of this patent is extended or adjusted under 35 U.S.C. 154(b) by 0 days.

(21) Appl. No.: 09/233,706

(22) Filed: Jan. 19, 1999

(51) Int. Cl.⁷ .......................... H01L 21/46; H01L 21/78; H01L 21/301; H01L 21/76; H01L 21/31

(52) U.S. Cl. .................. 438/462; 438/460; 438/424; 438/780; 438/958

(58) Field of Search ...................... 438/780, 462, 438/778, 958, 424

(56) References Cited

U.S. PATENT DOCUMENTS 4,829,014 * 5/1989 Yerman ........................... 437/8
4,904,610    2/1990 Shyr .............................. 437/15
5,482,887 * 1/1996 Duinkerken et al. ............ 437/62

* cited by examiner

Primary Examiner—Wael Fahmy
Assistant Examiner—Neal Berezny
(74) Attorney, Agent, or Firm—Mayer Fortkort & Williams, PC; Karin L. Williams, Esq.

(57) ABSTRACT

A wafer-level process for fabricating a plurality of passivated semiconductor devices comprising the steps of providing a semiconductor wafer on that at least one p-n junction is formed, Cutting a plurality of grooves in said wafer to expose said at least one p-n junction, wherein each of said grooves extends partly through the wafer and has a depth that is enough to expose said at least one p-n junction, applying a passivating material into said grooves and curing the material. The grooves can be formed by using a disc saw having a blade, by performing a sandblasting operation within a controlled operation time, or by performing a photolithographically chemical etching process. The passivating material is either screen-printed or pin-dispensed into the grooves. A dicing operation can be subsequently proceeded to divide the wafer into individual chips for subsequent fabrication into completed semiconductor devices.

6 Claims, 1 Drawing Sheet

METHOD FOR FABRICATING PASSIVATED SEMICONDUCTOR DEVICES

BACKGROUND OF THE INVENTION

The invention relates to a wafer-level process for fabricating a plurality of passivated semiconductor devices, and more particularly relates to a simpler, cheaper and environmentally friendly wafer-level process for fabricating a plurality of passivated low- and high-voltage semiconductor devices.

The manufacturing process of a semiconductor device, such as a rectifier, can be roughly divided into four stages; that is, junction formation, junction exposure, junction passivation and contact formation.

The known process of the junction formation stage comprises doping a wafer by diffusion to provide a p-n layer suitable for the intended application.

The known process of the junction exposure stage comprises cutting a plurality of grooves to form a plurality of chips. The cutting operation may be performed by a disc sass having a blade that is adapted to cut partly through the thickness of the wafer. Then, the wafer is fractured along the lines of the cut into the individual chips. Alternatively, the Cutting operation can also be performed by a sandblasting operation wherein stainless steel resistant elements are bonded in the shape of the desired chips onto the surface of the wafer. Then a blast of sand wears grooves through the wafer around the edges of the resistant elements to divide the wafer into the desired chips. Since the handling of the individual chips in the subsequent processes is cumbersome and expensive, several wafer-level processes are proposed. U.S. Pat. No. 4,904,610 provides a process which comprises the steps of mounting the wafer on a substrate by an intervening layer of adhesive and cutting a multiplicity of grooves in the mounted wafer to form a plurality of chips wherein the grooves extend entirely through the wafer and partly through the layer of adhesive without extending into the substrate. The process of U.S. Pat. No. 4,904,610 requires a further step of using a solvent (hazardous and environmentally harmful) to remove the layer of adhesive. Besides, the way that discrete chips are bonded onto a substrate by a layer of adhesive cannot always provide a firm connection among the chips as that of a true wafer. The widely adapted wafer-level process in the junction exposure stage comprises photolithographic steps to etch grooves in the wafer to expose the p-n junction of the p-n layer wherein the grooves are partly through the wafer and have a depth that is enough to expose the p-n junction. However, the photolithographic steps are numerous and complex which in turn affect reliability.

In the junction passivation stage, the process of U.S. Pat. No. 4,904,610 comprises the step of applying a silicone resin onto the grooved wafer to fill the grooves with the resin. The silicone resin covers the surfaces of the chips in addition to the grooves, and thus after the resin is cured a further step of removing the resin covering the surfaces of the chips is needed. Another conventional process uses photolithography to apply glass into the grooves to passivate the junctions. However, as discussed above, the photolithographic steps are cumbersome and complex.

The widely adapted process in the contact formation stage comprises photolithographical etching contact which is cumbersome and complex. The process of U.S. Pat. No. 4,904,610 forms the contacts (electrodes) by a three-step plating operation at the beginning of the whole process, and the whole surface of the wafer is gold-plated after the three-step plating operation. In the subsequent steps of the process of U.S. Pat. No. 4,904,610, the gold plating on the portions to be grooved will be removed and thus wasted.

Therefore, a wafer-level process, for fabricating passivated low- and high-voltage semiconductor devices, that is simpler, cheaper, environmentally friendly and can avoid the shortcomings of the mentioned prior art is needed.

SUMMARY OF THE INVENTION

An objective of the invention is to provide a wafer-level process, for fabricating a plurality of passivated semiconductor devices, that can eliminate part of or all the steps of photolithographic steps.

Another objective of the invention is to provide a true wafer-level process that is simpler, cheaper and more environmentally friendly than the process of U.S. Pat. No. 4,904,610.

According to the process embodying the present invention, in the junction exposure stage, a cutting step to form a plurality of grooves to expose the p-n junctions formed in a wafer is provided wherein each of the grooves extends partly through the wafer and has a depth that is enough to expose the p-n junctions. To eliminate the cumbersome steps of photolithography and the use of an adhesive layer proposed in U.S. Pat. No. 4,904,610, the cutting step according to one embodiment of the present invention can be performed by using a disc saw having a blade or by a sandblasting operation. The sawing operation according to the present invention is different from that of prior art. Instead of cutting a certain depth through the wafer and fracturing the wafer along the lines of the Cult into individual chips, the sawing operation according to the present invention just cuts a depth, through the wafer, that is enough to expose the p-n junctions. Besides, the sandblasting operation according to the present invention does not divide the wafer into individual chips as taught by prior art, but forms grooves extending partly through the wafer and having depths enough to expose the p-n junctions by controlling the time of the sandblasting operation.

To further eliminate the complex photolithographic steps or the additional step of removing the passivating material covering the surfaces of the chips needed in the process of U.S. Pat. No. 4,904,610, the process of the junction passivation stage, according to another embodiment of the present invention comprises the step of screen printing a screen-printable passivating material into the grooves, or the step of pin dispensing a pin-dispensable passivating material into the grooves wherein the passivating material is directly applied into the grooves only, and thus the process of the junction passivation stage is greatly simplified.

To form contacts of the devices, the process according to a further embodiment of the present invention comprises the steps, before cutting the grooves, of plating a first nickel plate on the surface of the wafer and sintering the first nickel plate as well as the steps, after the junction passivation stage of plating a second nickel plate on the surface of the sintered first nickel plate and plating a gold plate on the surface of the second nickel plate. The above process is simpler than the conventional photolithographic contact etching process and is more cost-effective than the process of U.S. Pat. No. 4,904,610.

DETAILED DESCRIPTION OF THE PREFERRED EMBODIMENTS

The present invention relates to a wafer-level process, for fabricating a plurality of passivated semiconductor devices, that is simpler, cheaper and more environmentally friendly than conventional processes.

Figure 1:
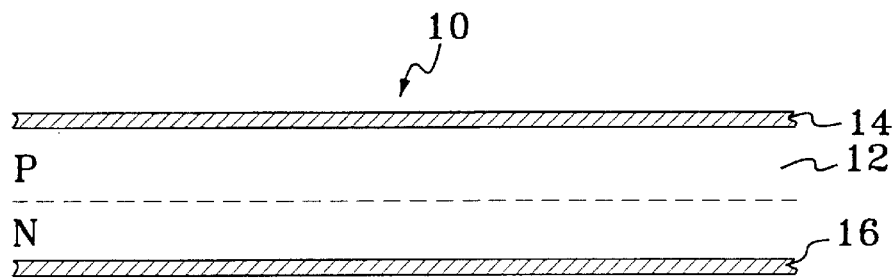
FIG. 1 is a partial cross-sectional view of a wafer structure used in a process according to one embodiment of the present invention.

FIG. 1 illustrates a wafer stricture 10 utilized in a process embodying the present invention. The structure 10 comprises a wafer 12 that, by way of example, is doped by diffusion to provide a p-n layer. The p-n layer shown in FIG. 1 is for the purpose of illustration, and the relative positions of the p layer and the n layer can be switched, i.e. the n layer is on the top of the p layer. Each face of the wafer 12 is plated with a first nickel plate 14 (16) which is subsequently sintered. In another embodiment of the present invention, the surfaces of the sintered nickel plates are subsequently further nickel plated, and then the surfaces of the newly plated nickel plates are gold plated to form contacts.

Figure 2:
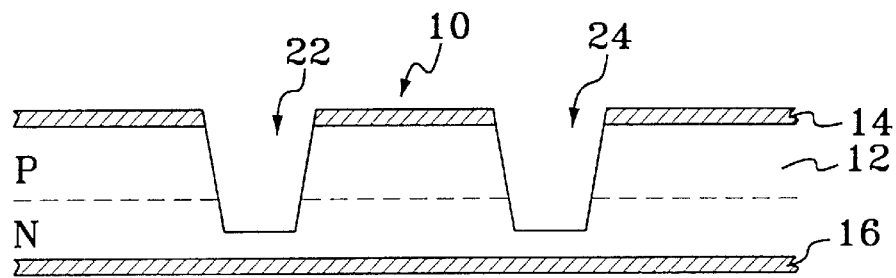
FIG. 2 is a partial cross-sectional vie of the structure of FIG. 1 wherein the wafer is grooved.

The next step of the process embodying the present invention and illustrated in FIG. 2 is to cut a plurality of grooves 22 and 24 wherein the grooves 22 and 24 are beveled (i.e. V-shape groove) and partly through the thickness of the wafer, and each of the grooves 22 and 24 has a depth that is enough to expose the junction of the p-n layer. The grooves 22 and 24 can be formed by using a disc saw having a blade or by a sandblasting operation or by a conventional process of photolithographic chemical etching. According to an embodiment of the present invention, the grooves 22 and 24 are formed by a sandblasting operation wherein the time of the sandblasting operation is controlled such that the grooves 22 and 24 extend partly through the thickness of the wafer and the depth of each of the grooves 22 and 24 is enough to expose the p-n junction.

Figure 3:
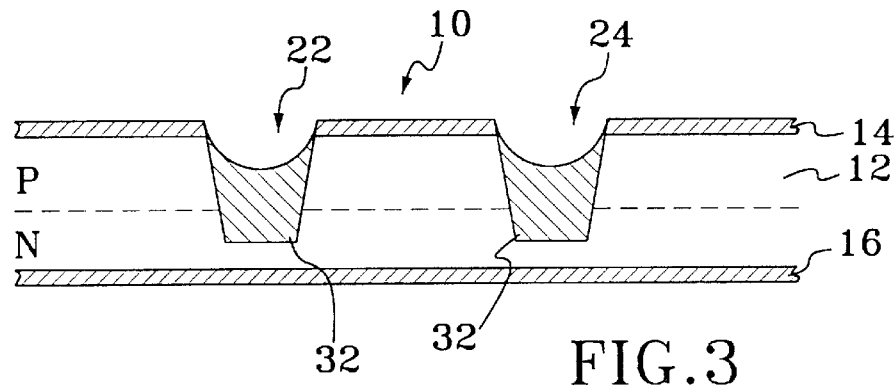
FIG. 3 is a partial cross-sectional view of the structure of FIG. 2 wherein the grooves are filled with a passivating material.

The subsequent step of the process embodying the present invention, as illustrated in FIG. 3, is to apply passivating material 32 into the grooves 22 and 24. According to an embodiment of the present invention, the passivating material 32 is screen-printable and is screen-printed into the grooves 22 and 24. The screen-printable passivating material used in the process embodying the present invention may be a polyimide. According to another embodiment of the present invention, the passivating material is pin-dispensable and is pin-dispensed into the grooves 22 and 24. The pin-dispensable material used in the embodiment of the present invention may be a polyimide. Either screen-printing or pin-dispensing are simpler than the conventional process including photolithographic steps and the process proposed in U.S. Pat. No. 4,904,610. Although both screen-printing and pin-dispensing are known techniques, they, are neither used nor suggested to apply passivating material in a wafer-level process for the reason that the conventional passivating materials, such as silicon resin and glass, are neither screen-printable nor pin-dispensable.

Figure 4:
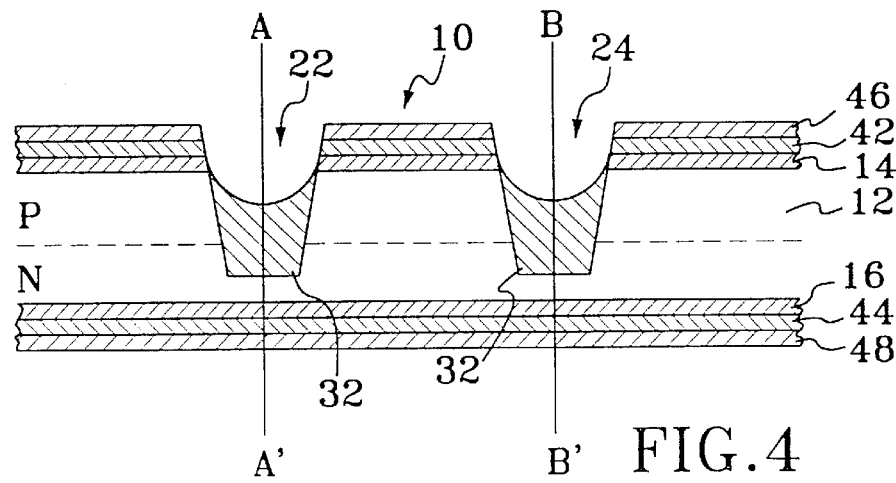
FIG. 4 is a partial cross-sectional view of the structure of FIG. 3 wherein a second nickel plating and a gold plating are proceeded.

The subsequent steps of the process embodying the present invention and illustrated in FIG. 4 comprise plating a second nickel plate 42 (44) on the surface of each of the sintered first nickel plate 14 (16) and plating a gold plate 46 (48) on the surface of each of the second nickel plate 42 (44) so as to form contacts. The surface of the passivating material cannot be nickel-plated nor gold-plated, and thus no further steps are needed in the plating operation. After the wafer-level process embodying the present invention, a dicing operation can be proceeded to divide the wafer (along the lines such as A–A' and B–B') into individual junction-passivated chips. The dicing operation may be provided by using a laser beam or by using a disc saw having a blade.

By the foregoing description, various processes embodying the present invention have been disclosed. However, numerous modifications and substitutions may be made without deviating from the scope of the present invention. Therefore, the above illustration is to disclose the present invention but not to limit the scope thereof.

What is claimed is:

1. A method for fabricating a plurality of passivated semiconductor devices comprising the steps of:

providing a semiconductor water in that at least one p-n junction is formed;

cutting a plurality of beveled grooves in said wafer to expose said at least one p-n junction,
wherein each of said grooves extends partly through the wafer and has a depth that is enough to expose said at least one p-n junction;

screen printing a screen-printable passivating material into said groove, and curing said material.

2. A method as set forth in claim 1 wherein said grooves are cut by using a blade.

3. A method as set forth in claim 1 wherein said grooves are formed by performing a sandblasting operation, and the time of said operation is controlled such that the depth of each of the grooves is enough to expose said at least one p-n junction.

4. A method as set forth in claim 1 wherein said grooves are formed by performing a photolithographically chemical etching process.

5. A method as set forth in claim 1 wherein said screen printable passivating material is a polyimide.

6. A method as set forth in claim 1 further comprising the steps, after the providing step, of plating a first nickel plate on each surface of said wafer and sintering said first nickel plates and the steps, after the curing step, of plating a second nickel plate on the surface of each of the sintered first nickel plates and plating a gold plate on the surface of each of the second nickel plates.

* * * * *

UNITED STATES PATENT AND TRADEMARK OFFICE
CERTIFICATE OF CORRECTION

PATENT NO. : 6,291,316 B1
DATED : September 18, 2001
INVENTOR(S) : Christopher Michael Knowles et al.

It is certified that error appears in the above-identified patent and that said Letters Patent is hereby corrected as shown below:

Column 1,
Line 21, change "sass" to -- saw --.
Line 25, change "Cutting" to -- cutting --.

Column 2,
Line 32, change "Cult" to -- cut --.

Column 3,
Line 1, change "vie" to -- view --.
Line 17, change "stricture" to -- structure --.

Column 4,
Line 1, after "they", delete -- , --.

Claim 1,
Line 29, change "water" to -- wafer --.

Signed and Sealed this

Nineteenth Day of March, 2002

Attest:

JAMES E. ROGAN
*Director of the United States Patent and Trademark Office*

*Attesting Officer*